US006991486B2

(12) United States Patent
Takai et al.

(10) Patent No.: US 6,991,486 B2
(45) Date of Patent: Jan. 31, 2006

(54) CONNECTOR AND MOUNTING STRUCTURE OF CONNECTOR TO SUBSTRATE

(75) Inventors: Tatsuya Takai, Aichi (JP); Katsumasa Matsuoka, Aichi (JP); Yoshiaki Kato, Aichi (JP); Shigeru Hayashi, Aichi (JP); Kazunori Nakane, Kariya (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 0 days.

(21) Appl. No.: 10/457,494

(22) Filed: Jun. 9, 2003

(65) Prior Publication Data

US 2004/0014338 A1 Jan. 22, 2004

(30) Foreign Application Priority Data

Jun. 11, 2002 (JP) ........................................ 2002-170010

(51) Int. Cl.
*H01R 13/64* (2006.01)

(52) U.S. Cl. ........................................ 439/247; 439/553
(58) Field of Classification Search ................. 439/247, 439/248, 246, 569, 573, 553, 552
See application file for complete search history.

(56) References Cited

U.S. PATENT DOCUMENTS

| 2,438,371 | A | * | 3/1948 | Marholz ..................... 439/247 |
| 3,673,545 | A | * | 6/1972 | Rundle ....................... 439/248 |
| 4,048,438 | A |   | 9/1977 | Zimmerman |
| 4,056,300 | A |   | 11/1977 | Schumacher |
| 4,738,631 | A | * | 4/1988 | Takahashi et al. .......... 439/248 |
| 4,804,330 | A |   | 2/1989 | Makowski et al. |
| 4,992,054 | A | * | 2/1991 | Cassan ....................... 439/892 |
| 4,998,887 | A |   | 3/1991 | Kaufman et al. |
| 5,185,042 | A |   | 2/1993 | Ferguson |
| 5,201,663 | A | * | 4/1993 | Kikuchi et al. ............... 439/83 |
| 5,383,790 | A |   | 1/1995 | Kerek et al. |
| 5,690,513 | A |   | 11/1997 | Fink et al. |
| 5,902,149 | A | * | 5/1999 | Tashiro et al. ............. 439/557 |
| 6,234,817 | B1 | * | 5/2001 | Hwang ....................... 439/247 |
| 6,325,652 | B1 | * | 12/2001 | Grant ......................... 439/248 |
| 6,334,789 | B1 |   | 1/2002 | Koyama |
| 6,399,896 | B1 |   | 6/2002 | Downes, Jr. et al. |
| 6,408,508 | B1 |   | 6/2002 | Farnworth et al. |
| 6,435,890 | B2 | * | 8/2002 | Kato et al. .................. 439/247 |
| 6,561,829 | B2 | * | 5/2003 | Maeda et al. ............... 439/247 |
| 6,609,922 | B2 | * | 8/2003 | Torii .......................... 439/247 |
| 2002/0011353 | A1 |   | 1/2002 | Kamath et al. |

FOREIGN PATENT DOCUMENTS

| DE | 39 31 551 A1 | 4/1991 |
| EP | 0 438 280 A1 | 7/1991 |
| EP | 0 571 879 A2 | 12/1993 |
| EP | 0 821 447 A2 | 1/1998 |

* cited by examiner

*Primary Examiner*—Gary Paumen
(74) *Attorney, Agent, or Firm*—Crompton, Seager & Tufte, LLC

(57) ABSTRACT

A connector that can be mounted to a substrate in a stable manner and a mounting structure of the connector to the substrate are provided. A connector according to the present invention includes a housing, which has a base, bosses, and terminals. Gaps are formed on portions of the base between the terminals and the bosses. The gaps extend to surround the terminals. Another connector according to the present invention includes a housing, which has a base, arms, bosses, and terminals. The arms are flexible and extend from the housing. Each boss is located at the distal end of one of the arms.

9 Claims, 5 Drawing Sheets

US 6,991,486 B2

CONNECTOR AND MOUNTING STRUCTURE OF CONNECTOR TO SUBSTRATE

BACKGROUND OF THE INVENTION

The present invention relates to a connector and a mounting structure of the connector to a substrate.

In the prior art, a connector 114 as shown in FIG. 10 has been proposed. The connector 114 includes a housing 111, which has a base 112, and terminals 113, which extend straight. The terminals 113 are supported by the base 112. A pair of bosses 116 is formed on the outer side surface of the housing 111.

When the connector 114 is attached to a substrate, which is a print-circuit board 115, the bosses 116 are secured to the print-circuit board 115 with screws 117. The terminals 113 are electrically connected to printed wiring (not shown), which is located on the print-circuit board 115, with solder 118. This secures the terminals 113 to the print-circuit board 115.

The connector 114 is, for example, mounted to an automobile as an in-vehicle part. Since the housing 111, which includes the bosses 116, is made of synthetic resin, the housing 111 selectively expands and contracts when exposed to temperature variation. In other words, the dimension of the housing 111 changes in accordance with the temperature. Since temperature variation in an automobile is great, dimensional variation of the housing 111 is relatively large. The dimensional variation of the housing 111 causes stress on the solder 118, which connects the terminals 113 to the printed wiring. The stress applied to the solder 118 is reduced by deformation of the base 112.

However, portions of the base 112 in the vicinity of the bosses 116 do not deform as easily as portion of the base 112 apart from the bosses 116. Thus, the stress applied to portions of the solder 118 located in the vicinity of the bosses 116 is not reduced as much as the stress applied to portions of the solder 118 located apart from the bosses 116. Consequently, the connector 114 is mounted to the print-circuit board 115 in an unstable manner.

SUMMARY OF THE INVENTION

Accordingly, it is an objective of the present invention to provide a connector that can be mounted to a substrate in a stable manner.

Another objective of the present invention is to provide a mounting structure of a connector that can be mounted to a substrate in a stable manner.

To provide the above objective, the present invention provides a connector mounted to a substrate. The connector includes a housing, a boss, a terminal, and a permitting mechanism. The housing has a base. The boss is located on the housing and is secured to the substrate. The terminal is supported by the base and is secured to the substrate. The permitting mechanism is located between the terminal and the boss. The permitting mechanism permits relative displacement between the boss and the base to reduce stress generated at a joint portion between the terminal and the substrate.

The present invention also provides a mounting structure of a connector to a substrate. The connector includes a housing, a boss, and a terminal. The housing has a base. The boss is located on the housing and is secured to the substrate. The terminal is supported by the base and is secured to the substrate. The substrate has an absorbing mechanism, which absorbs dimensional variation of the boss to reduce stress generated at a joint portion between the terminal and the substrate.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A first embodiment of the present invention will now be described with reference to FIGS. 1 and 2.

Figure 1:
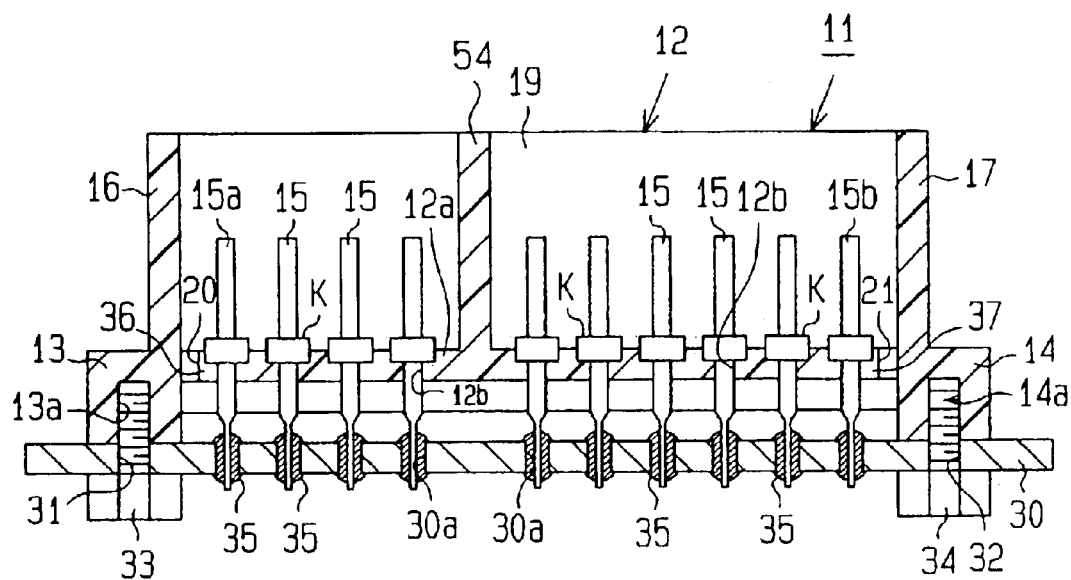
FIG. 1 is a cross-sectional view illustrating a connector according to a first embodiment of the present invention mounted to a print-circuit board.
Figure 2:
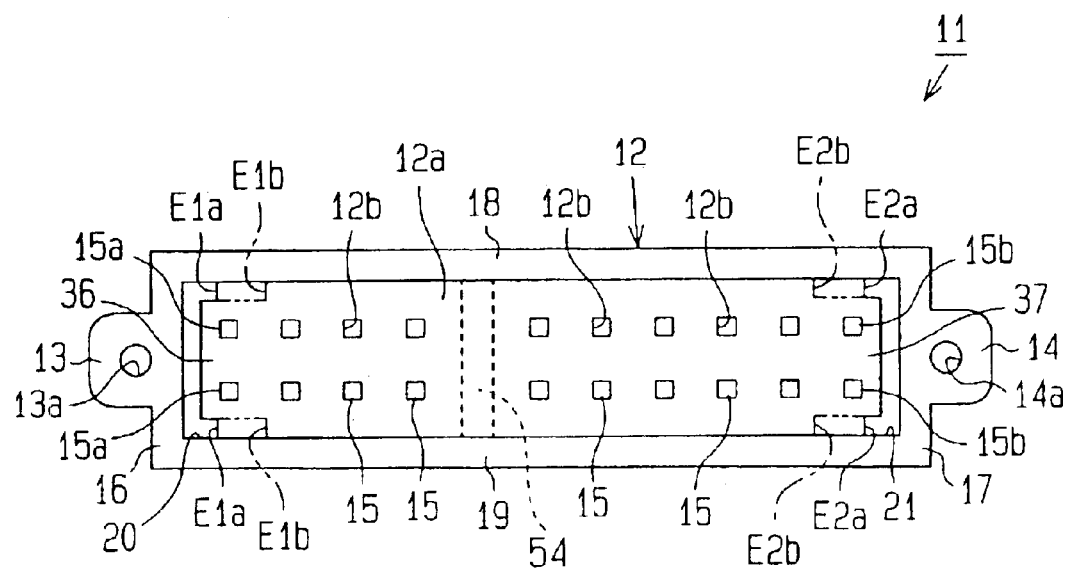
FIG. 2 is a bottom view illustrating the connector shown in FIG. 1.

As shown in FIGS. 1 and 2, a connector 11 according to the first embodiment includes a housing 12, a pair of bosses 13, 14, and terminals 15. The housing 12 and the bosses 13, 14 are formed integrally with each other out of synthetic resin. The terminals 15 are made of conductive metal and extend straight.

The housing 12 is box-shaped and has a base 12a, a pair of short side walls 16, 17, a pair of long side walls 18, 19, and a partition 54. The base 12a is substantially rectangular as shown in FIG. 2. The short side walls 16, 17 face each other in the longitudinal direction of the base 12a. The long side walls 18, 19 face each other in the lateral direction of the base 12a. The partition 54 is located between and parallel to the short side walls 16, 17.

The boss 13 projects from the outer side surface of the short side wall 16. The boss 14 projects from the outer side surface of the short side wall 17. The boss 13 has a threaded bore 13a, which is open downward. The boss 14 has a threaded bore 14a, which is open downward.

The connector 11 is, for example, mounted to a substrate, which is a print-circuit board 30 shown in FIG. 1 with screws 33, 34. The print-circuit board 30 has a pair of mounting holes 31, 32, which correspond to the threaded bores 13a, 14a. When mounting the connector 11 to the print-circuit board 30, the bosses 13, 14 are located on the print-circuit board 30 such that each of the threaded bores 13a, 14a aligns with the corresponding mounting hole 31 or 32. In this state, the screw 33 is screwed to the threaded bore 13a through the mounting hole 31 and the screw 34 is screwed to the threaded bore 14a through the mounting hole 32.

When the connector 11 is mounted to the print-circuit board 30, the terminals 15 are perpendicular to the print-circuit board 30. The connector 11, which is mounted to the print-circuit board 30 with the terminals 15 arranged perpendicular to the print-circuit board 30, is generally referred to as a perpendicular-type connector. The base 12a is located above the lower end of the bosses 13, 14. Therefore, when the connector 11 is mounted to the print-circuit board 30, a space is formed between the base 12a and the print-circuit board 30.

The base 12a has support holes 12b. The support holes 12b are arranged along the longitudinal direction of the base 12a in two lines extending parallel to each other. Each terminal 15 is press-fitted in one of the support holes 12b. Accordingly, the terminals 15 are supported by the base 12a. A stopper K is formed at a middle position of each terminal 15 in the longitudinal direction of the terminal 15. When each terminal 15 is press-fitted in the corresponding support hole 12b, the stopper K is secured to the base 12a, which restricts the amount of press-fit of each terminal 15 to the corresponding support hole 12b.

Through holes 30a are formed on portions of the print-circuit board 30 opposite to the support holes 12b. Each terminal 15, which is press-fitted in one of the support holes 12b, is inserted in the corresponding through hole 30a. The terminals 15 are then electrically connected to printed wiring (not shown) located on the lower surface of the print-circuit board 30 with solder 35. This secures the terminals 15 to the print-circuit board 30.

A gap 20 is formed between the base 12a and the short side wall 16. In other words, the gap 20 is formed on one of the longitudinal ends of the base 12a between the long side wall 18 and the long side wall 19. A gap 21 is formed between the base 12a and the short side wall 17. In other words, the gap 21 is formed on the other longitudinal end of the base 12a between the long side wall 18 and the long side wall 19. The gaps 20, 21 extend along the outer edge of the base 12a in a square bracket form. In other words, the gap 20 extends to surround two of the terminals 15 closest to the short side wall 16, or outside terminals 15a. The gap 21 extends to surround two of the terminals 15 closest to the short side wall 17, or outside terminals 15b. Therefore, the longitudinal ends of the base 12a function as flexible parts 36, 37, which can deform in the vertical direction as viewed in FIG. 1. Ends E1a of the gap 20 are located closer to the short side wall 16 than the outside terminal 15a. Ends E2a of the gap 21 are located closer to the short side wall 17 than the outside terminal 15b.

The gap 20 functions as a permitting mechanism, which permits relative displacement of the boss 13 and the base 12a. The gap 21 functions as a permitting mechanism, which permits relative displacement of the boss 14 and the base 12a.

The connector 11 is, for example, mounted to an automobile as an in-vehicle part. The housing 12 and the bosses 13, 14 are made of synthetic resin. Therefore, when exposed to temperature variation, the housing 12 and the bosses 13, 14 selectively expand and contract. When the dimension of the boss 13 changes in the vertical direction of FIG. 1, the gap 20 permits the boss 13 to be displaced with respect to the base 12a. This prevents a stress caused by the dimensional variation of the boss 13 from being transmitted to the base 12a and a joint portion between the terminals 15 and the print-circuit board 30, that is, the solder 35. When the dimension of the boss 14 changes in the vertical direction of FIG. 1, the gap 21 permits the boss 14 to be displaced with respect to the base 12a. This prevents a stress caused by the dimensional variation of the boss 14 from being transmitted to the base 12a and the solder 35. Therefore, the stress applied to the solder 35 is reduced.

The first embodiment provides the following advantages.

The gaps 20, 21 are formed between the base 12a and the short side walls 16, 17. Therefore, stress generated by the dimensional variation of the bosses 13, 14 is hardly transmitted to the solder 35. Thus, the stability between the print-circuit board 30 and the connector 11, which is mounted to the print-circuit board 30, is improved without increasing the amount of the solder 35.

The stress applied to the solder 35 is reduced by the gaps 20, 21. Therefore, the stability between the print-circuit board 30 and the connector 11, which is mounted to the print-circuit board 30, is improved without increasing the number of parts.

The gaps 20, 21, which extend in the square bracket form, facilitate the displacement of the bosses 13, 14 with respect to the base 12a in a more suitable manner than gaps, which simply extend straight along the lateral direction of the base 12a.

The connector 11 uses conventional terminals as the terminals 15. Therefore, the connector 11 is advantageous in cost performance.

A second embodiment of the present invention will now be described with reference to FIGS. 3 and 4. The differences from the first embodiment of FIGS. 1 and 2 will mainly be discussed below.

Figure 3:
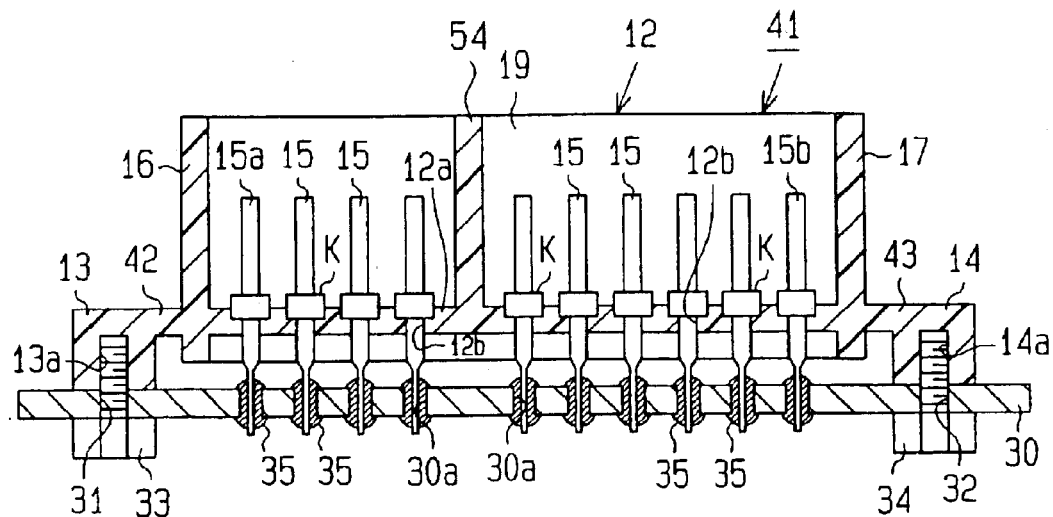
FIG. 3 is a cross-sectional view illustrating a connector according to a second embodiment mounted to a print-circuit board.
Figure 4:
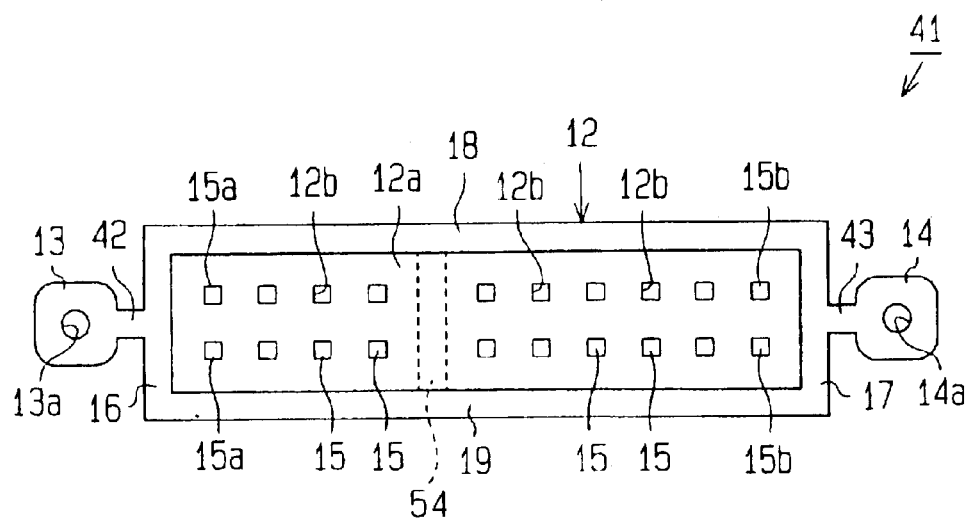
FIG. 4 is a bottom view illustrating the connector shown in FIG. 3.

As shown in FIGS. 3 and 4, in a connector 41 of the second embodiment, the boss 13 is located at the distal end of an arm 42, which extends from the outer side surface of the short side wall 16. The boss 14 is located at the distal end of an arm 43, which extends from the outer side surface of the short side wall 17. The arms 42, 43 are made of synthetic resin and are flexible. The arms 42, 43 are formed integrally with the housing 12 and the bosses 13, 14. The gaps 20, 21 are omitted in the second embodiment.

The arm 42 functions as a permitting mechanism, which permits relative displacement between the boss 13 and the base 12a. The arm 43 functions as a permitting mechanism, which permits relative displacement between the boss 14 and the base 12a.

If the dimension of the boss 13 is changed in the vertical direction of FIG. 3, the arm 42 permits the displacement of the boss 13 with respect to the base 12a. Thus, stress caused by the dimensional variation of the boss 13 is prevented from being transmitted to the base 12a and the solder 35. If the dimension of the boss 14 is changed in the vertical direction of FIG. 3, the arm 43 permits the displacement of the boss 14 with respect to the base 12a Thus, stress caused by the dimensional variation of the boss 14 is prevented from being transmitted to the base 12a and the solder 35. Therefore, the stress applied to the solder 35 is reduced. The displacement of the bosses 13, 14 with respect to the base 12a is permitted by the deformation of the arms 42, 43.

The second embodiment provides the following advantages.

The bosses 13, 14 are located at the distal ends of the arms 42, 43, which are flexible. Therefore, the stress caused by the dimensional variation of the bosses 13, 14 is hardly transmitted to the solder 35. Consequently, the stability between the print-circuit board 30 and the connector 41, which is mounted to the print-circuit board 30, is improved without increasing the amount of the solder 35.

The stress applied to the solder 35 is reduced by the deformation of the arms 42, 43, which are formed integrally with the housing 12 and the bosses 13, 14. Therefore, the stability between the print-circuit board 30 and the connector 41, which is mounted to the print-circuit board 30, is improved without increasing the number of parts.

A third embodiment of the present invention will now be described with reference to FIGS. 5 and 6. The differences from the first embodiment of FIGS. 1 and 2 will mainly be discussed below.

Figure 5:
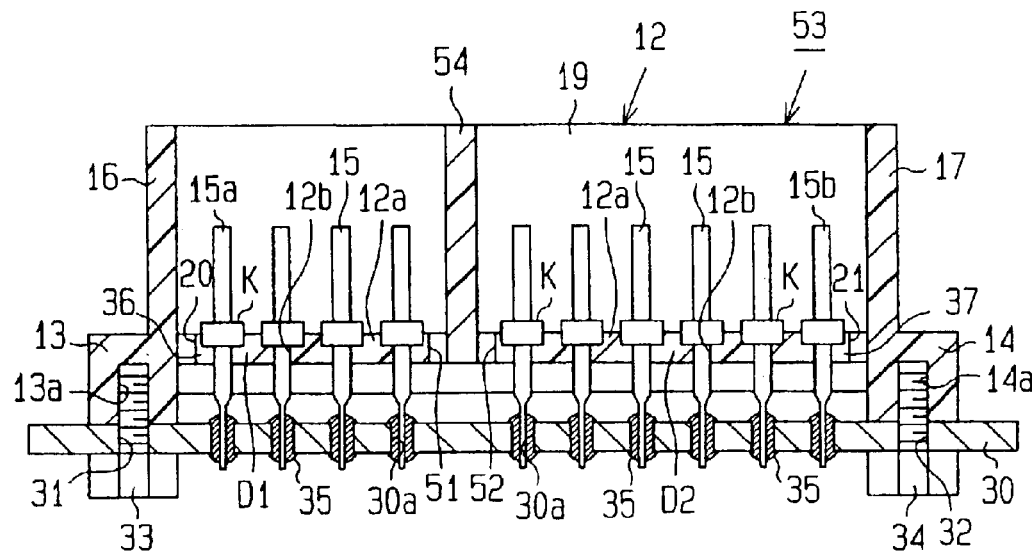
FIG. 5 is a cross-sectional view illustrating a connector according to a third embodiment mounted to a print-circuit board.
Figure 6:
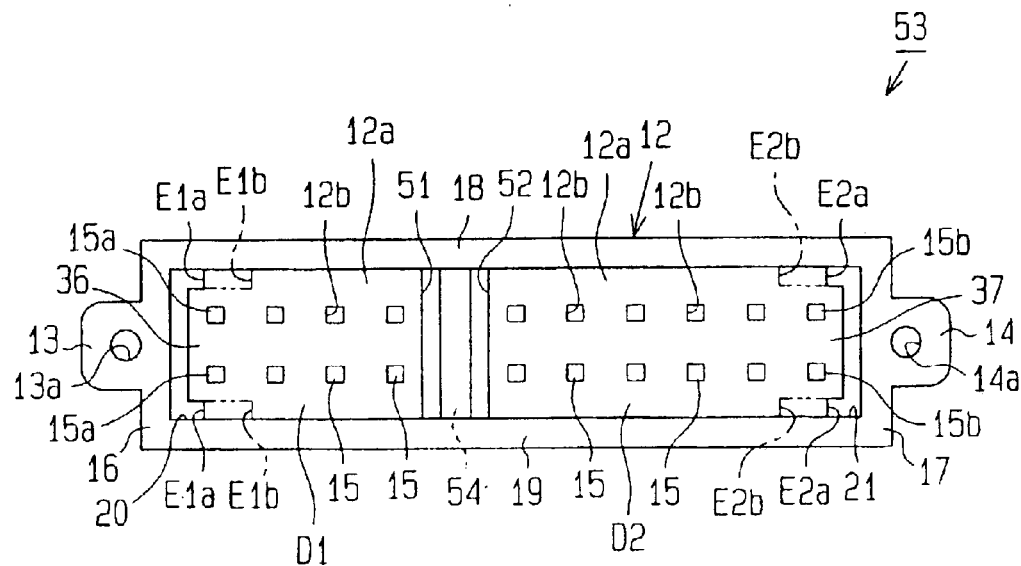
FIG. 6 is a bottom view illustrating the connector shown in FIG. 5.

As shown in FIGS. 5 and 6, in a connector 53 of the third embodiment, elongated holes 51, 52 are formed on the base 12a at both sides of the partition 54. In other words, the elongated holes 51, 52 are formed at the middle portion of the base 12a in the longitudinal direction of the base 12a. The elongated holes 51, 52 extend along the lateral direction of the base 12a from one end to the other end. Therefore, the base 12a is separated into a piece D1, which is located between the short side wall 16 and the partition 54, and a piece D2, which is located between the short side wall 17 and the partition 54.

Generally, dimensional variation of a plate made of synthetic resin in accordance with temperature variation is reduced when the dimension is decreased. That is, the dimensional variation of the base 12a in the longitudinal direction reduces as the longitudinal dimension is reduced. Therefore, the base 12a of the connector 53 according to the third embodiment dose not expand or contract in the longitudinal direction as easily as the base 12a of the connector 11 according to the first embodiment when exposed to temperature variation. Therefore, the terminals 15, which are supported by the base 12a according to the third embodiment, do not move along the longitudinal direction of the base 12a as easily as the terminals 15, which are supported by the base 12a according to the first embodiment.

The third embodiment provides the following advantages in addition to the advantages of the first embodiment.

The base 12a is separated into two pieces D1, D2 in the longitudinal direction of the base 12a. Therefore, movement of the terminals 15, which are supported by the base 12a, in the longitudinal direction of the base 12a is suppressed. That is, the solder 35 is hardly affected by stress caused by the movement of the terminals 15 in the longitudinal direction of the base 12a. Consequently, the stability between the print-circuit board 30 and the connector 53, which is mounted to the print-circuit board 30, is improved.

A fourth embodiment of the present invention will now be described with reference to FIGS. 7 and 8. The differences from the second embodiment of FIGS. 3 and 4 will mainly be discussed below.

Figure 7:
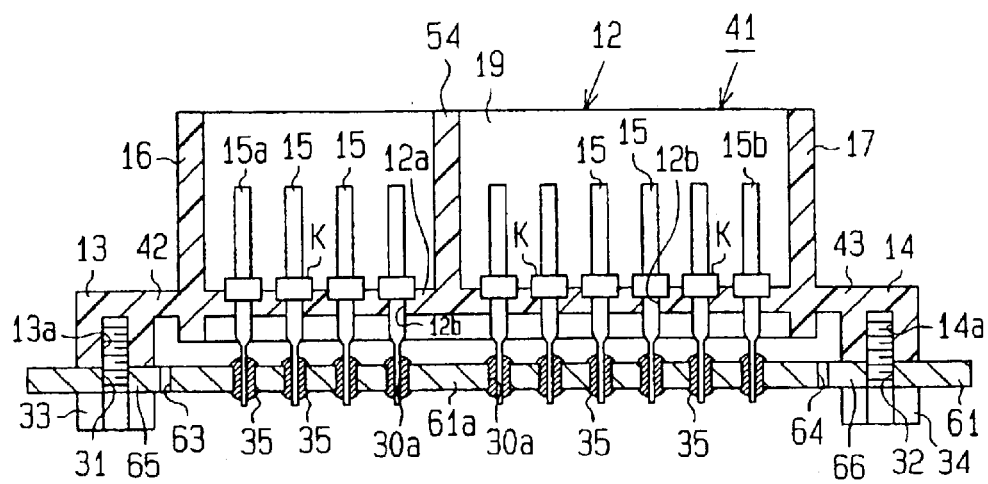
FIG. 7 is a cross-sectional view illustrating a connector according to a fourth embodiment mounted to a print-circuit board.
Figure 8:
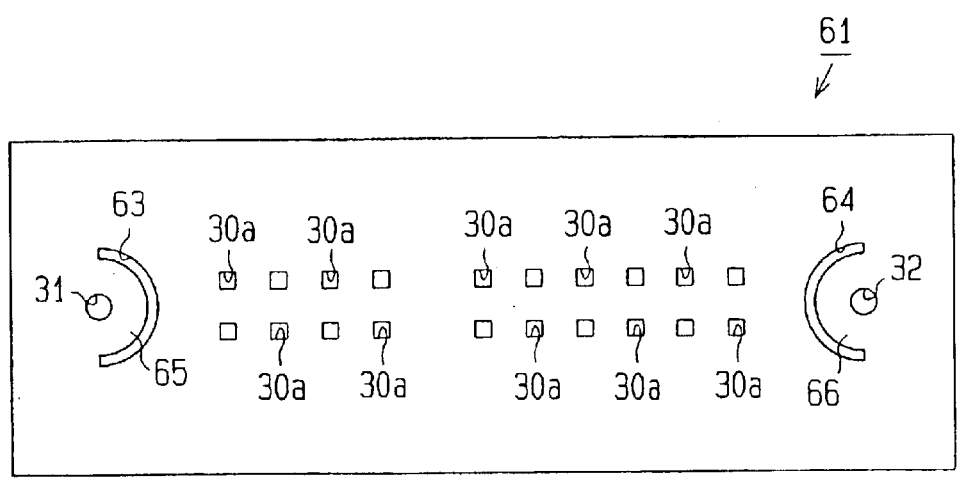
FIG. 8 is a bottom view illustrating the print-circuit board shown in FIG. 7.

As shown in FIG. 7, in the fourth embodiment, the connector 41 shown in FIG. 4 is mounted to a print-circuit board 61 that is different from the print-circuit board 30 shown in FIG. 3. As shown in FIGS. 7 and 8, a surrounding hole 63 is formed at a portion of the print-circuit board 61 that corresponds to the boss 13 of the connector 41. A surrounding hole 64 is formed at a portion of the print-circuit board 61 that corresponds to the boss 14 of the connector 41. The surrounding holes 63, 64 surround the bosses 13, 14, respectively. Semicircular portions of the print-circuit board 61 surrounded by the surrounding holes 63, 64 function as flexible portions 65, 66, which deform with respect to other portion of the print-circuit board 61. The surrounding hole 63 defines the flexible portion 65 and the surrounding hole 64 defines the flexible portion 66.

In the same manner as the second embodiment, each arm 42, 43 permits the displacement of the corresponding boss 13 or 14 with respect to the base 12a to prevent stress caused by the dimensional variation of the boss 13 or 14 from being transmitted to the base 12a. In the fourth embodiment, the flexible portion 65 further deforms to cancel the dimensional variation of the boss 13 to absorb the dimensional variation of the boss 13. In addition, the flexible portion 66 deforms to cancel the dimensional variation of the boss 14 to absorb the dimensional variation of the boss 14. That is, the flexible portion 65 functions as an absorbing mechanism for absorbing dimensional variation of the boss 13 and the flexible portion 66 functions as an absorbing mechanism for absorbing dimensional variation of the boss 14.

The fourth embodiment provides the following advantages in addition to the advantages of the second embodiment.

The dimensional variation of each boss 13, 14 is absorbed by the corresponding flexible portion 65 or 66. Therefore, stress applied to the solder 35 by the dimensional variation of the bosses 13, 14 is reduced. Consequently, the stability between the print-circuit board 30 and the connector 41, which is mounted to the print-circuit board 30, is further improved.

It should be apparent to those skilled in the art that the present invention may be embodied in many other specific forms without departing from the spirit or scope of the invention. Particularly, it should be understood that the invention may be embodied in the following forms.

Figure 9A:
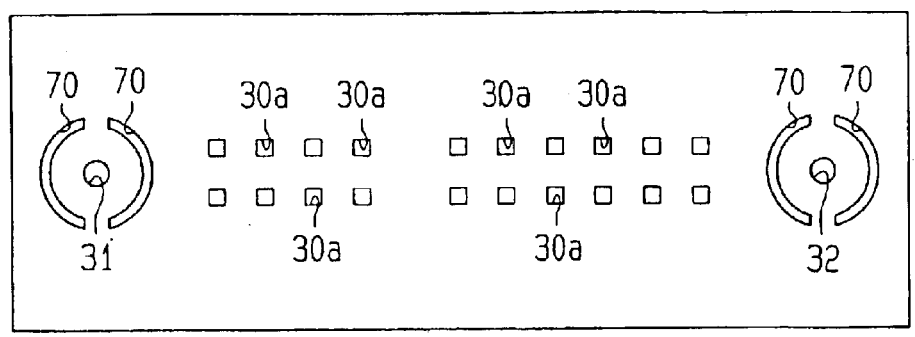
FIG. 9A is a bottom view illustrating a print-circuit board according to a modified embodiment.

In the fourth embodiment, the surrounding holes 63, 64 of the print-circuit board 61 need not be semicircular as long as each surrounding hole 63, 64 surrounds the corresponding boss 13 or 14. That is, the surrounding holes 63, 64 may be modified to extend in a square bracket form. Alternatively, as shown in FIG. 9A, each surrounding hole 63, 64 may be modified to be formed by two arcuate holes 70.

Figure 9B:
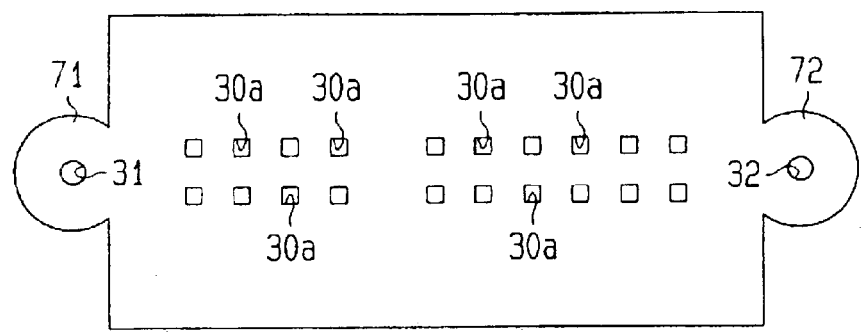
FIG. 9B is a bottom view illustrating a print-circuit board according to another modified embodiment.
Figure 10:
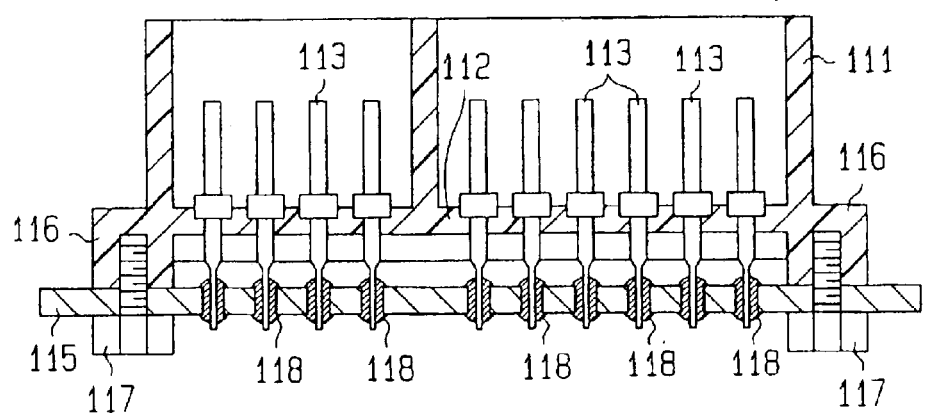
FIG. 10 is a cross-sectional view illustrating a prior art connector mounted to a print-circuit board.

In the fourth embodiment, the print-circuit board 61 may be changed to a print-circuit board 62, which has flexible portions 71, 72, as shown in FIG. 9B. The flexible portion 71 is located at a portion of the print-circuit board 62 that corresponds to the boss 13 of the connector 41. The flexible portion 72 is located at a portion of the print-circuit board 62 that corresponds to the boss 14 of the connector 41. The flexible portions 71, 72 deform with respect to the portion of the print-circuit board 62 other than the flexible portions 71, 72. In this modified embodiment, the mounting hole 31 is formed in the flexible portion 71 and the mounting hole 32 is formed in the flexible portion 72.

In the second and fourth embodiments, the gaps 20, 21 shown in FIGS. 1 and 2 may be formed at the longitudinal ends of the base 12a.

In the first and third embodiments, the gaps 20, 21 may be changed to arcuate gaps.

In the first and third embodiments, the gap 20 may be changed to a gap, which has ends E1b (shown by a chain double-dashed line in FIGS. 2 and 6) located closer to the partition 54 than the outside terminal 15a. The gap 21 may be changed to a gap, which has ends E2b (shown by a chain double-dashed line in FIGS. 2 and 6) located closer to the partition 54 than the outside terminal 15*b*.

The number of the terminals 15 of the connector 11, 41, 53 need not be plural but may be one.

The support holes 12*b* may be arranged in one line or in three or more lines.

The present examples and embodiments are to be considered as illustrative and not restrictive and the invention is not to be limited to the details given herein, but may be modified within the scope and equivalence of the appended claims.

What is claimed is:

1. A connector mounted to a substrate, the connector comprising:
    a housing, wherein the housing has a base;
    a boss located on the housing, wherein the boss is secured to the substrate;
    a terminal supported by the base, wherein the terminal is secured to the substrate; and
    a permitting mechanism located between the terminal and the boss, wherein the permitting mechanism permits relative displacement between the boss and the base to reduce stress generated at a joint portion between the terminal and the substrate,
    wherein the permitting mechanism includes a gap located on the base and penetrating the base, and wherein the boss and the base are integrated with each other without the terminal being located in between the boss and the base.

2. The connector according to claim 1, wherein the terminal is one of a plurality of terminals, and wherein at least one of the terminals is located closer to the boss than the other terminals.

3. The connector according to claim 1, wherein the terminal is one of a plurality of terminals, and wherein the gap extends to surround at least one of the terminals.

4. The connector according to claim 1, wherein the permitting mechanism includes an arm, which extends from the housing, wherein the arm is flexible, and wherein the boss is located at the distal end of the arm.

5. A connector mounted to a substrate, the connector comprising:
    a housing, wherein the housing has a base;
    a boss located on the housing, wherein the boss is secured to the substrate;
    a terminal supported by the base, wherein the terminal is secured to the substrate; and
    a permitting mechanism located between the terminal and the boss, wherein the permitting mechanism permits relative displacement between the boss and the base to reduce stress generated at a joint portion between the terminal and the substrate,
    wherein the base comprises a plurality of separate pieces.

6. A connector mounted to a substrate, the connector comprising:
    a housing, wherein the housing has a base;
    a boss located on the housing, wherein the boss is secured to the substrate;
    a terminal supported by the base, wherein the terminal is secured to the substrate; and
    a gap located on the base, wherein the gap extends to surround at least part of the terminal so that a portion of the base surrounded by the gap functions as a flexible part, wherein the gap is located between the terminal and the boss, and wherein the gap permits relative displacement between the boss and the base, and
    wherein the boss and the base are integrated with each other without the terminal being located in between the boss and the base.

7. A connector mounted to a substrate, the connector comprising:
    a housing, wherein the housing has a base;
    an arm, which extends from the housing, wherein the arm is flexible;
    a boss located at the distal end of the arm, wherein the boss is secured to the substrate, and the arm permits relative displacement between the boss and the base; and
    a terminal supported by the base, wherein the terminal is secured to the substrate.

8. A mounting structure of a connector to a substrate, the connector comprising:
    a housing, wherein the housing has a base;
    a boss located on the housing, wherein the boss is secured to the substrate; and
    a terminal supported by the base, wherein the terminal is secured to the substrate,
    wherein the substrate has an absorbing mechanism, and wherein the absorbing mechanism absorbs dimensional variation of the boss to reduce stress generated at a joint portion between the terminal and the substrate;
    wherein the absorbing mechanism includes a flexible portion located on the substrate, wherein the boss is secured to the flexible portion, wherein the terminal is secured to a portion of the substrate other than the flexible portion, and wherein the flexible portion deforms with respect to the portion of the substrate other than the flexible portion to cancel the dimensional variation of the boss.

9. The mounting structure according to claim 8, wherein the substrate includes a surrounding hole, which surrounding hole defines the flexible portion.

* * * * *

UNITED STATES PATENT AND TRADEMARK OFFICE
CERTIFICATE OF CORRECTION

PATENT NO. : 6,991,486 B2
DATED : January 31, 2006
INVENTOR(S) : Tatsuya Takai et al.

It is certified that error appears in the above-identified patent and that said Letters Patent is hereby corrected as shown below:

<u>Column 7,</u>
Lines 41-53, delete and substitute -- The connector according to claim 1, wherein the base comprises a plurality of separate pieces. --.

Signed and Sealed this

Sixteenth Day of May, 2006

JON W. DUDAS
*Director of the United States Patent and Trademark Office*